(12) United States Patent
Fukagawa

(10) Patent No.: US 6,947,119 B2
(45) Date of Patent: Sep. 20, 2005

(54) DISTORTION MEASUREMENT METHOD AND EXPOSURE APPARATUS

(75) Inventor: Youzou Fukagawa, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/623,542

(22) Filed: Jul. 22, 2003

(65) Prior Publication Data

US 2004/0119956 A1 Jun. 24, 2004

(30) Foreign Application Priority Data

Jul. 30, 2002 (JP) ........................................ 2002-222024

(51) Int. Cl.[7] ...................... G03B 27/32; G03B 27/42; G03B 27/68
(52) U.S. Cl. ............................... 355/52; 355/53; 355/77
(58) Field of Search ........................... 355/52, 53, 77; 356/124

(56) References Cited

U.S. PATENT DOCUMENTS

| 4,585,342 A | * | 4/1986 | Lin et al. ..................... 356/124 |
| 4,780,616 A | * | 10/1988 | Nishi et al. ................. 250/548 |
| 4,908,656 A | * | 3/1990 | Suwa et al. .................... 355/53 |
| 5,402,224 A | | 3/1995 | Hirukawa et al. .......... 356/124 |

FOREIGN PATENT DOCUMENTS

| JP | 58-083853 | 5/1983 |
| JP | 63-38697 B2 | 8/1988 |
| JP | 3259190 | 12/2001 |

* cited by examiner

*Primary Examiner*—Rodney Fuller
(74) *Attorney, Agent, or Firm*—Fitzpatrick, Cella, Harper & Scinto

(57) ABSTRACT

A method includes steps of exposing each of first shot regions on a substrate to a plurality of first marks aligned at a predetermined interval via a master and a projection optical system, and exposing each of second shot regions on the substrate to a plurality of second marks aligned at the predetermined interval via the master and the projection optical system. The first and second shot regions are arranged so as to make positions of a plurality of transferred first and second marks on the substrate correspond to each other, and the number of the transferred first marks in the first shot region being larger than the number of the transferred second marks in the second shot region. In addition, a distortion amount of the projection optical system is calculated based on a positional difference measured for the transferred first and second marks which correspond to each other.

21 Claims, 15 Drawing Sheets

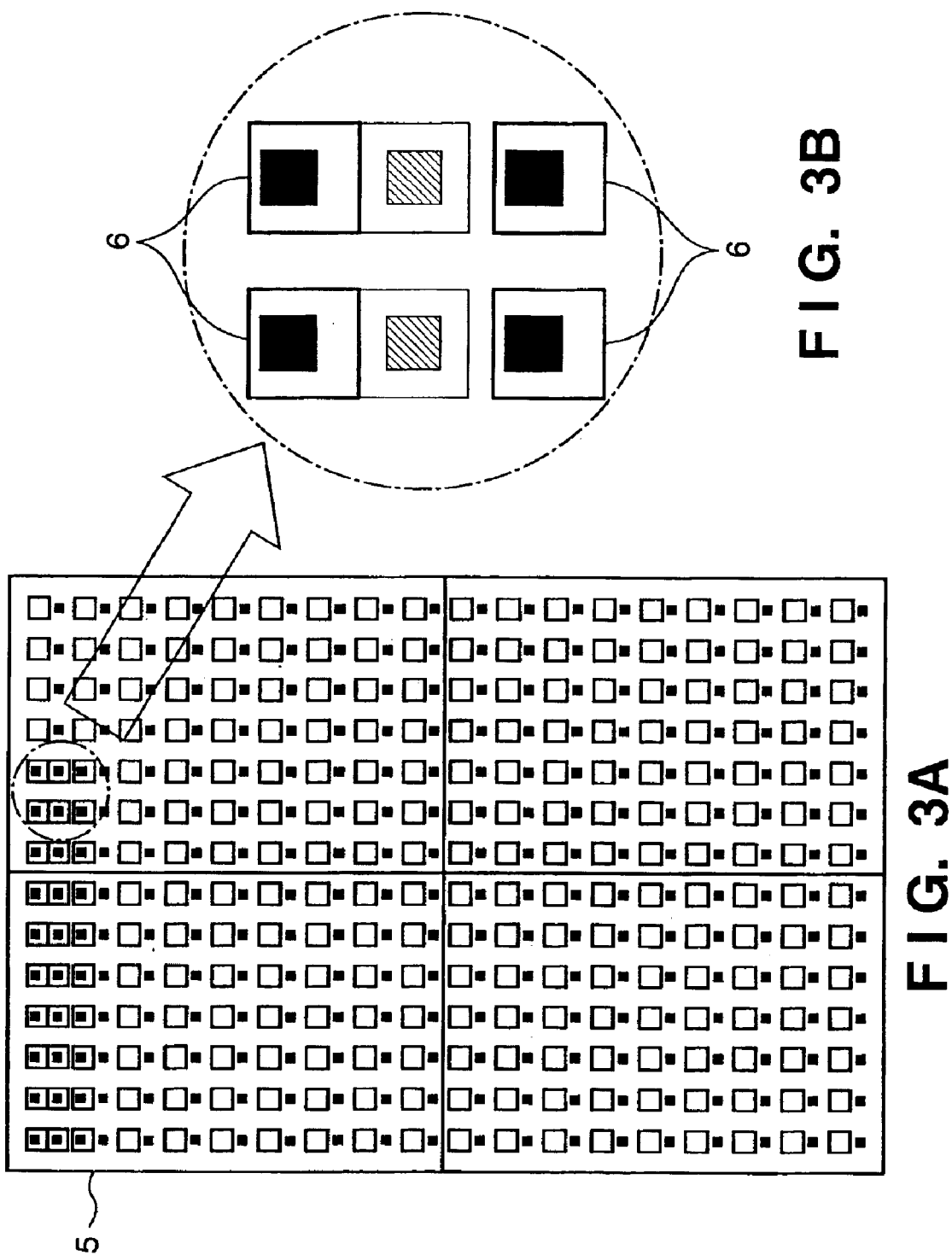

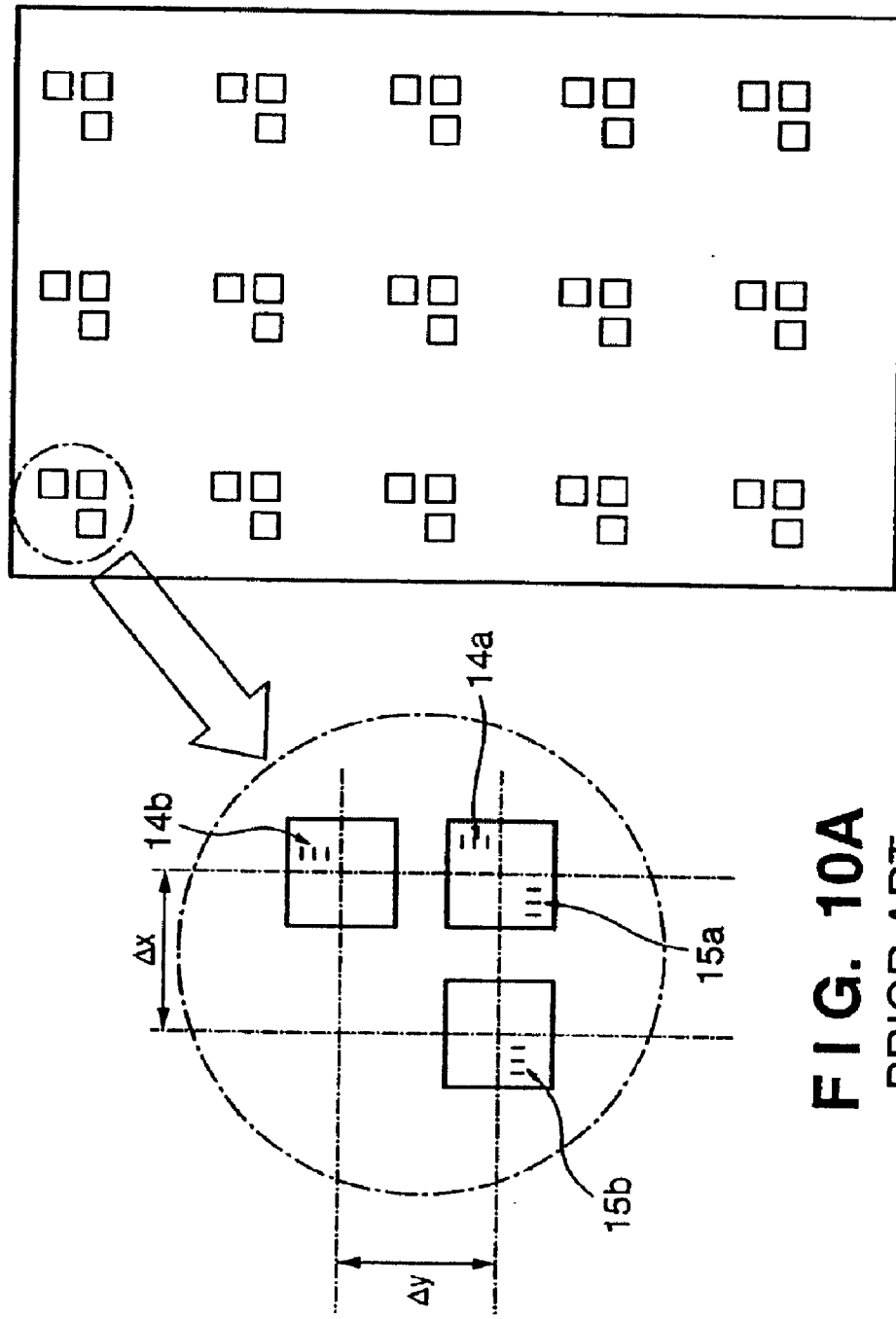

DISTORTION MEASUREMENT METHOD AND EXPOSURE APPARATUS

FIELD OF THE INVENTION

The present invention relates to a distortion measurement technique for manufacturing a device such as a semiconductor element, image sensing element (CCD or the like), a liquid crystal display element, a thin-film magnetic head, or the like.

BACKGROUND OF THE INVENTION

As disclosed in Japanese Patent No. 3,259,190, at least five methods are well known as a method of measuring a distortion (distortion component generated when a mask image is transferred onto a wafer) in the projection optical system of an exposure apparatus.

Of these methods, two methods disclosed in Japanese Patent No. 3,259,190 and Japanese Publication No. 63-38697 are proposed as a distortion measurement method using overlay of a main scale mark and a vernier scale mark.

(1) Method Disclosed in Japanese Patent Publication No. 63-38697

According to the method disclosed in this reference, a main scale mark 2 and vernier scale marks 1 which are formed on a test reticle as shown in FIG. 8A are transferred onto the resist layer of a photosensitive substrate, as shown in FIG. 8B. The misalignment amount of the overlay mark after developing (distance from the barycenter of the main scale mark to that of the vernier scale mark) is measured. In inspection, the vernier scale marks 1 on the entire reticle surface are transferred onto the photosensitive substrate. Exposure is repeated by sequentially moving the photosensitive substrate such that the main scale mark 2 overlaps the previously transferred vernier scale marks 1 at a plurality of points.

The photosensitive substrate is moved by a precision moving stage having a high-precision critical dimension measurement device such as a laser interferometer. The moving amount is uniquely determined in correspondence with the designed intervals between the central point and a plurality of points on the reticle. In exposure to the main scale mark 2, the moving stage is moved by a distance corresponding to the interval. The photosensitive substrate which has already been exposed to the vernier scale mark is exposed to the main scale mark 2. An overlay mark 13 as a result of overlaying the main scale mark and vernier scale marks is formed on the entire exposure region of the developed photosensitive substrate, as shown in FIG. 9. These marks are read visually (via a microscope), obtaining an overlay error amount at the target point. If the moving stage is accurately fed, the measurement value (overlay error amount) corresponds to a distortion amount at the target point.

(2) Method Disclosed in Japanese Patent No. 3,259,190.

The method disclosed in this reference uses a reticle having main scale marks 14a and 15a, and vernier scale marks 14b and 15b which are arranged at predetermined small intervals in two directions perpendicular to each other, as shown in FIGS. 10A and 10B. Distortion difference amounts in the two directions perpendicular to each other are transferred onto overlay marks at respective positions. A distortion is derived from the cumulative sum of misalignment amounts obtained by measurement using a microscope.

More specifically, a pattern on the entire surface of a test reticle is transferred onto a substrate by exposure. The substrate holding stage is moved by $\Delta y$ in the first direction and $\Delta x$ in the second direction such that the main scale marks 14a and 15a are moved adjacent to the previously transferred vernier scale marks 14b and 15b. Immediately after movement, an overlay mark as shown in FIGS. 11A and 11B is formed by exposure. The misalignment amounts of the two overlay marks formed in this manner exhibit distortion changes in the respective directions. The change amount is divided by the moving amount, obtaining a distortion inclination. The inclination is multiplied by each mark interval to obtain a cumulative sum. The distortion of the entire exposure region can therefore be calculated.

However, the conventional distortion measurement methods described above suffer from the following problems.

In measurement method (1), the feed error of the moving stage is added to the misalignment amount of the overlay mark, resulting in poor measurement precision. If the feed error of the moving stage varies irregularly, the precision can be increased by calculating the average value by a plurality of measurement operations. However, a plurality of measurement operations take a long time, increasing the inspection cost. In the presence of a regular feed error of the moving stage, the precision cannot be increased by a plurality of measurement operations.

Measurement method (2) executes only feed of the moving stage in two directions perpendicular to each other and at least two exposure operations, and the measurement time is short. However, the misalignment amount of the overlay mark which reflects a distortion change is divided by the distance between a corresponding main scale mark and vernier scale mark, obtaining a distortion inclination amount. The distortion inclination amount is multiplied by the distortion measurement interval, obtaining a change amount from an adjacent measurement point. In general, the distance from an adjacent measurement point is longer than the distance between a corresponding main scale mark and vernier scale mark. A small measurement error upon measuring a misalignment amount by a microscope increases by the distance ratio. The increased error is undesirably regarded as the cumulative sum and contained in the distortion.

In the above situation, demands have arisen for higher-precision distortion measurement.

SUMMARY OF THE INVENTION

According to one aspect of the invention, there is provided a distortion measurement method comprising: a first formation step of repeating, m×n times, shot exposure of arranging first marks on a photosensitive substrate via a reticle and a projection optical system in M rows and N columns at a predetermined column interval and a predetermined row interval, thereby forming first marks in M×m rows and N×n columns on the photosensitive substrate, M and m being natural numbers which are relatively prime, N and n being natural numbers which are relatively prime, and M>m and N>n; a second formation step of repeating, M×N times, shot exposure of arranging second marks on the photosensitive substrate via the reticle in m rows and n columns at the predetermined column interval and the predetermined row interval, thereby forming second marks in M×m rows and N×n columns on the photosensitive substrate, the first and second marks formed in the first and second formation steps forming M×m×N×n overlay marks; a measurement step of measuring misalignment amounts of the first and second marks for each of the M×m×N×n overlay marks; and a calculation step of calculating a distortion amount on the basis of the misalignment amounts measured in the measurement step.

According to another aspect of the invention, there is provided a method comprising: a first exposure step of exposing each of first shot regions on a substrate to a plurality of first marks aligned at a predetermined interval via a master and a projection optical system; a second exposure step of exposing each of second shot regions on the substrate to a plurality of second marks aligned at the predetermined interval via the master and the projection optical system, the first and second shot regions being so arranged as to make positions of a plurality of transferred first and second marks on the substrate correspond to each other, the plurality of transferred first and second marks being formed due to said first and second exposure steps, respectively, and the number of the transferred first marks in the first shot region being larger than the number of the transferred second marks in the second shot region; and a calculation step of calculating a distortion amount of the projection optical system based on a positional difference measured for the transferred first and second marks which correspond to each other.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 3A and 3B are views showing an overlay mark which is formed on a substrate up to the middle of the second layer in distortion measurement processing according to the embodiment;

FIGS. 10A and 10B are views for explaining the conventional distortion measurement method;

DETAILED DESCRIPTION OF THE PREFERRED EMBODIMENT

A preferred embodiment of the present invention will now be described in detail in accordance with the accompanying drawings.

The embodiment realizes higher-precision distortion. The outline of the measurement method will be explained with reference to FIGS. 1A to 3B.

A reticle has, on the entire exposure target surface, vernier scale marks drawn in $m_1$ rows and $n_1$ columns at a predetermined interval in the first direction (to be referred to as a column direction hereinafter) and the second direction (to be referred to as a row direction hereinafter) perpendicular to the first direction. In FIG. 1A, vernier scale marks 1 in nine rows and seven columns are arranged at an interval $p_x$ in the row direction and an interval $p_y$ in the column direction. The reticle also has, on part of the exposure target surface, main scale marks 2 drawn in at least $m_2$ rows and $n_2$ columns at the same intervals ($p_x$ and $p_y$) as those of the vernier scale marks. In this case, $m_1 > m_2$ and $n_1 > n_2$, and $m_1$ and $m_2$ are natural numbers which are relatively prime whereas $n_1$ and $n_2$ are natural numbers which are relatively prime. This example adopts two rows and two columns (that is, $m_2 = n_2 = 2$). FIG. 1A shows main scale marks 2 in nine rows and seven columns, similar to the vernier scale mark. The reticle is shielded by a light-shielding plate so as to transfer 2×2 vernier scale marks, as shown in FIG. 1B, as will be described later.

Figure 1B:
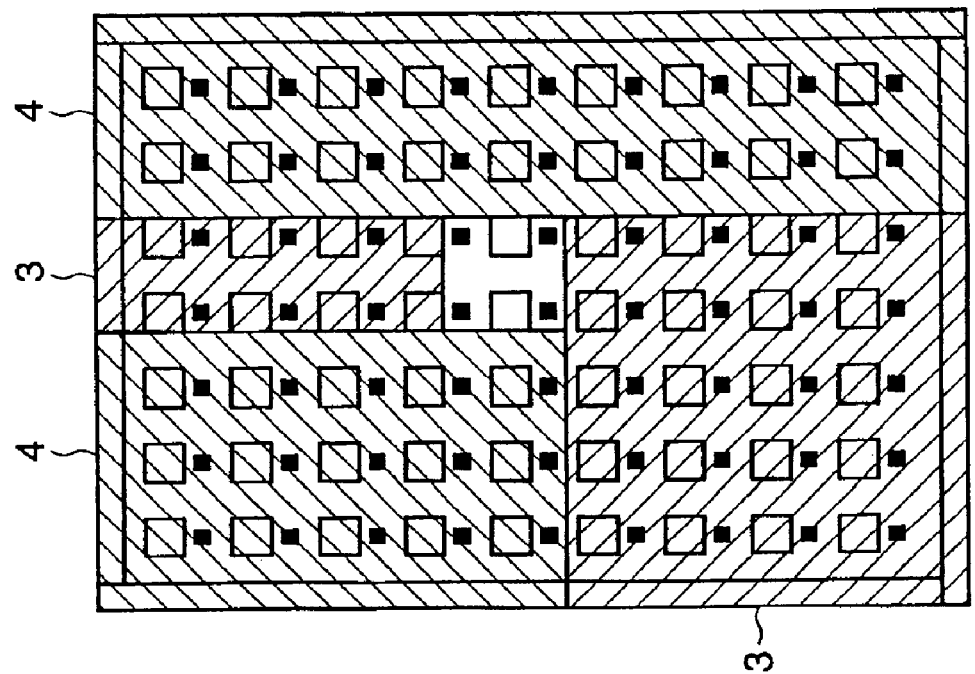
FIGS. 1A and 1B are views showing reticle-shielded states in the first and second layers in distortion measurement processing according to an embodiment.
Figure 1A:
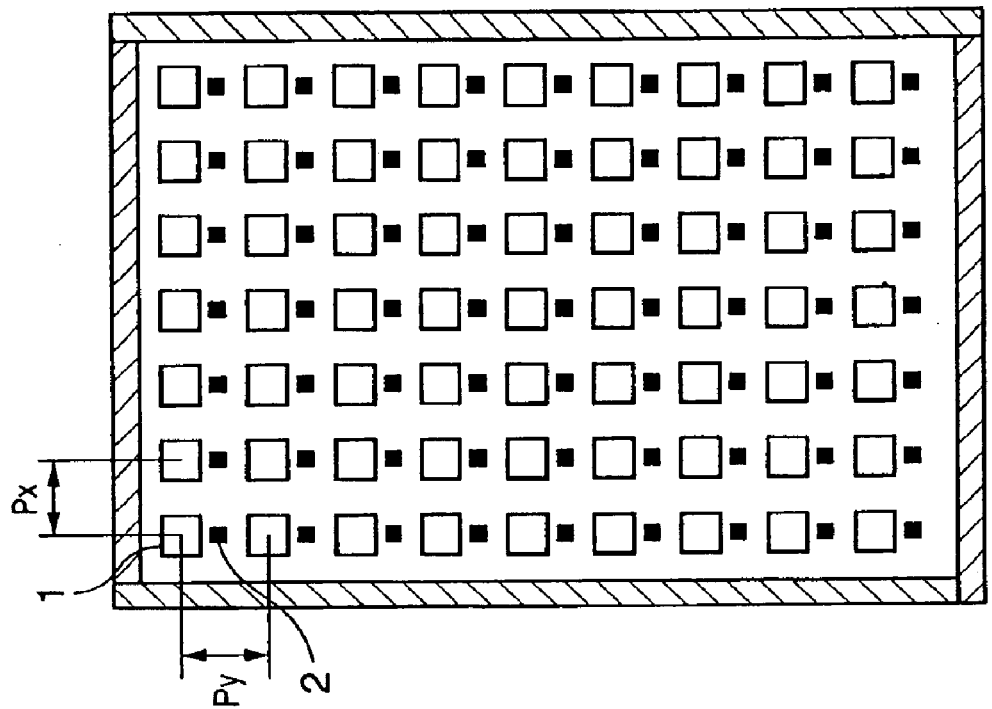
Figure 2:
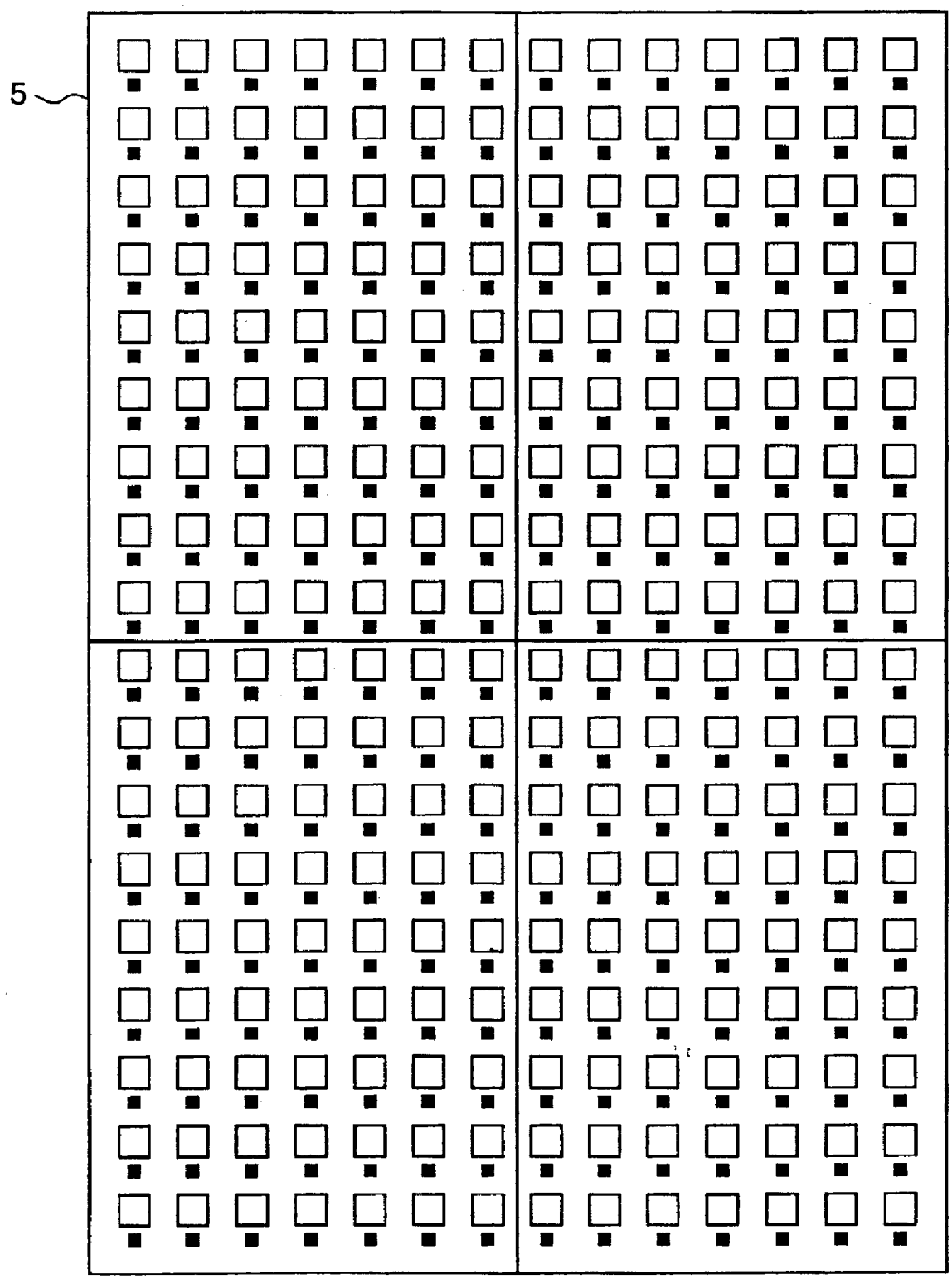
FIG. 2 is a view showing a mark that is transferred by the first layer onto a substrate in distortion measurement processing according to the embodiment.

In the first step, the $m_1 \times n_1$ vernier scale marks 1 arranged on the entire reticle surface as shown in FIG. 1A are transferred onto a substrate by one exposure apparatus subjected to distortion inspection (first layer exposure processing). The moving stage of the exposure apparatus is moved by a step in the column direction, and the first layer exposure processing is so done as to successively align the vernier scale marks 1 in a region adjacent in the column direction. This operation is repeated $m_2$ times. Also, in the row direction, step movement and transfer are so repeated as to successively align the vernier scale marks in a region adjacent in the row direction. This operation is repeated $n_2$ times in the row direction. That is, step movement by a $p_x \times n_1$ distance in the row direction, or step movement by a $p_y \times m_1$ distance in the column direction, and the first layer exposure processing are repeated $m_2 \times n_2$ times, transferring $m_2 \times n_2$ shots 5 on the substrate, as shown in FIG. 2 (in FIG. 2, 2×2=4 shots).

In the second step, while the light-shielding plate is so set as to expose only part of the region, as shown in FIG. 1B, $m_2 \times n_2$ main scale marks (2×2 main scale marks in FIG. 1B) are simultaneously transferred (second layer exposure processing). The substrate is moved by a step in the column direction and/or row direction using the moving stage, transferring main scale marks. This processing is repeated to form overlay marks of vernier and main scale marks on the vernier scale marks which are transferred by the first layer exposure processing. That is, $p_x \times n_2$ step movement in the row direction and/or $p_y \times m_2$ step movement in the column direction, and the second layer exposure processing are repeated $m_1 \times n_1$, times, forming overlay marks in $m_1 \times m_2$ rows in the column direction and $n_1 \times n_2$ columns in the row direction, i.e., $m_1 \times n_1 \times m_2 \times n_2$ overlay marks. In the example of FIGS. 1A to 3B, 7×9×2×2=252 overlay marks are formed. No developing processing is interposed between the first and second layer exposure processes.

FIG. 3A shows an intermediate state in the second step. FIG. 3B shows four enlarged overlay marks formed by one exposure. Which of exposure processes in the first and second steps is performed, i.e., which of vernier scale marks and main scale marks are first transferred can be arbitrarily set.

In the third step, the misalignment amounts of $N=m_1 \times m_2 \times n_1 \times n_2$ formed overlay marks are measured with a microscope.

In the fourth step, values obtained by measuring the overlay marks are substituted into column vectors on the left side in equations 1 to 14 to be described later, and the equations are solved. At this time, a vernier scale mark position error within the shot transferred by the first layer that corresponds to a distortion (which will be described later) can be obtained. In addition, the position error of each shot transferred by the first layer, the position error of each shot transferred by the second layer, and the relative position error of $m_2 \times n_2$ main scale marks transferred by the second layer can be obtained.

In the above-described conventional distortion measurement method (1) (method disclosed in Japanese Patent Publication No. 63-38697), various error amounts are added to a distortion measurement value. In this embodiment, a distortion and various error amounts are separated, and the distortion measurement error can be greatly decreased.

Figure 4A:
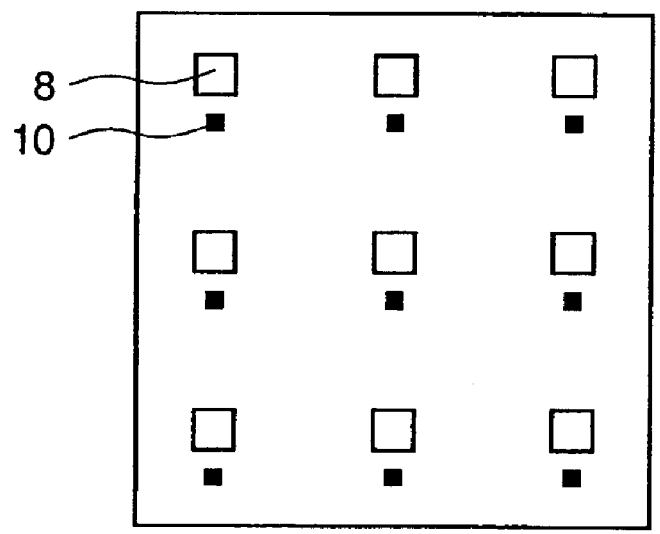
FIGS. 4A and 4B are views showing a definition example of a distortion within a shot.

The distortion measurement method according to the embodiment will be explained in detail by exemplifying $m_1=3$, $n_1=3$, $m_2=2$, and $n_2=2$ as a simpler example. FIG. 4A shows a mark pattern example in this case in which 3×3 vernier scale marks and 3×3 main scale marks are formed. In exposure of the main scale marks, 2×2 main scale marks are transferred by a method as shown in FIG. 1B.

Figure 4B:
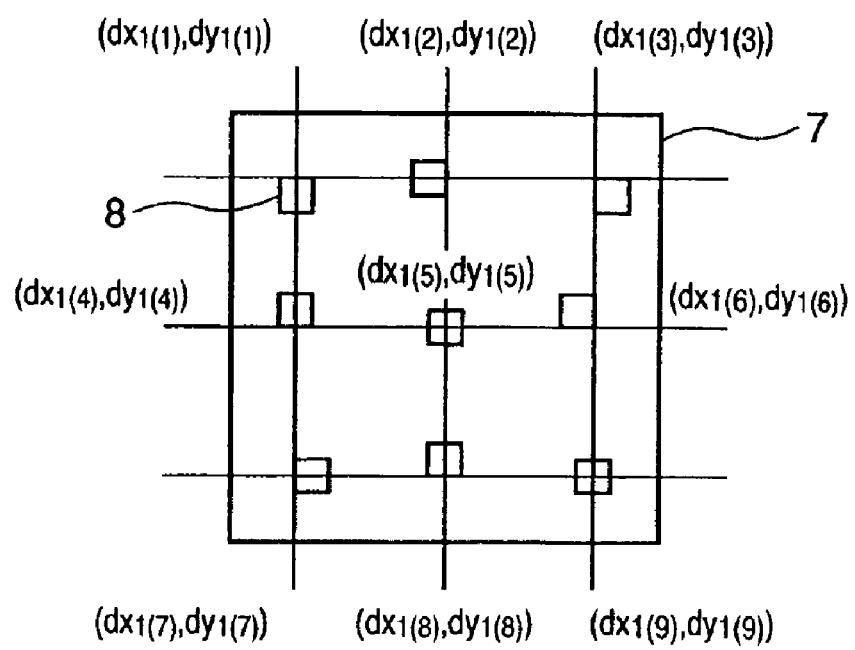
Figure 5:
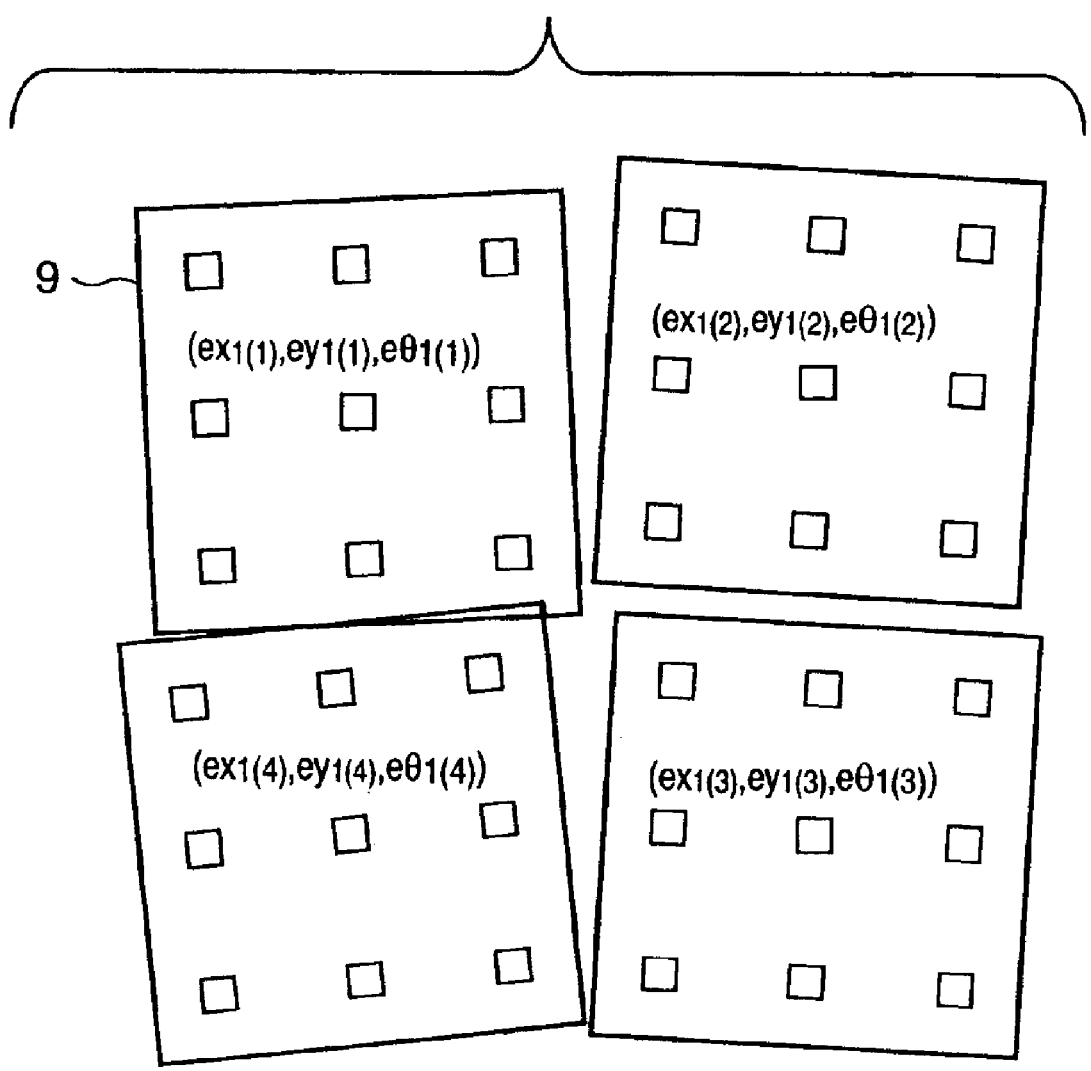
FIG. 5 is a view showing a definition example of the alignment error of each shot transferred by the first layer.

As shown in FIG. 4B, the distortion amount of the position of each vernier scale mark 8 in a shot 7 transferred onto a substrate is defined as variables $dx_1$ and $dy_1$. FIG. 5 shows shots in the first layer aligned such that two shots are adjacent to each other in the vertical and horizontal directions. Each shot is formed by scanning exposure (step and scan type exposure) or by block exposure (step and repeat type exposure) in which a whole shot area is exposed at once. Each shot 9 has errors $ex_2$, $ey_1$, and $e\theta_1$ in position and rotation angle that are caused by stage alignment error. The relative positions between vernier scale marks within each shot are equal.

Figure 6:
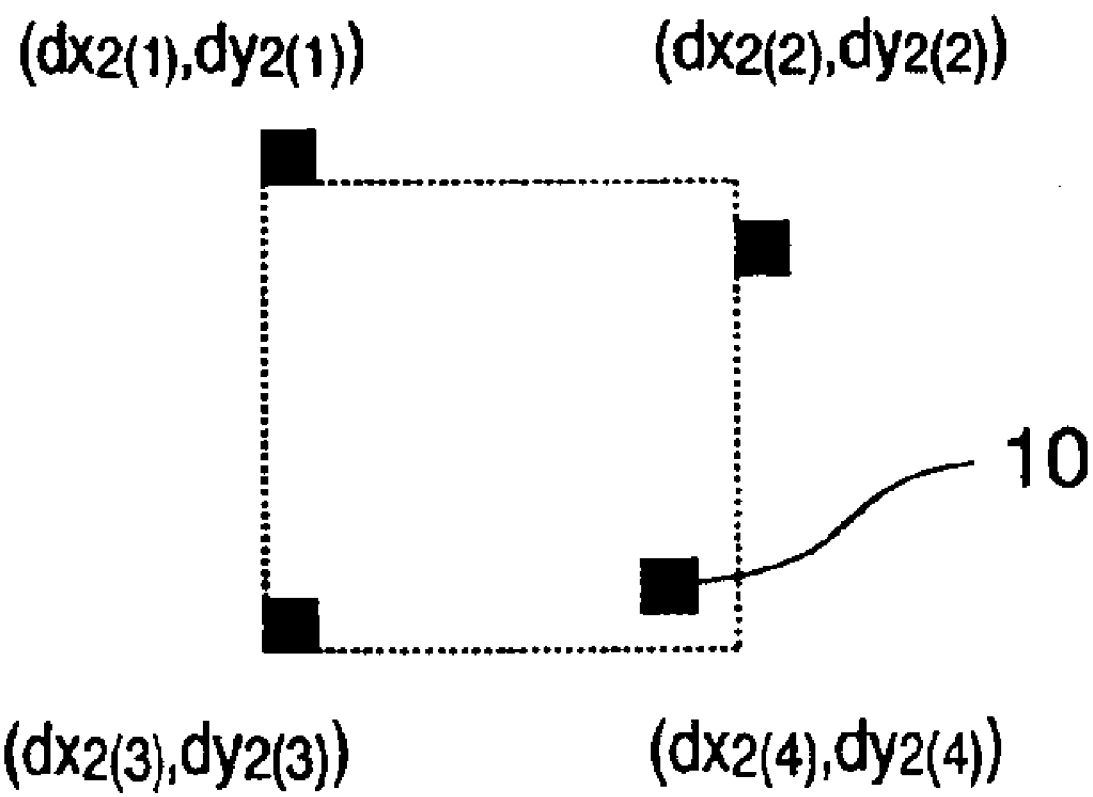
FIG. 6 is a view showing a definition example of the relative position error of a main scale mark transferred by the second layer.
Figure 7:
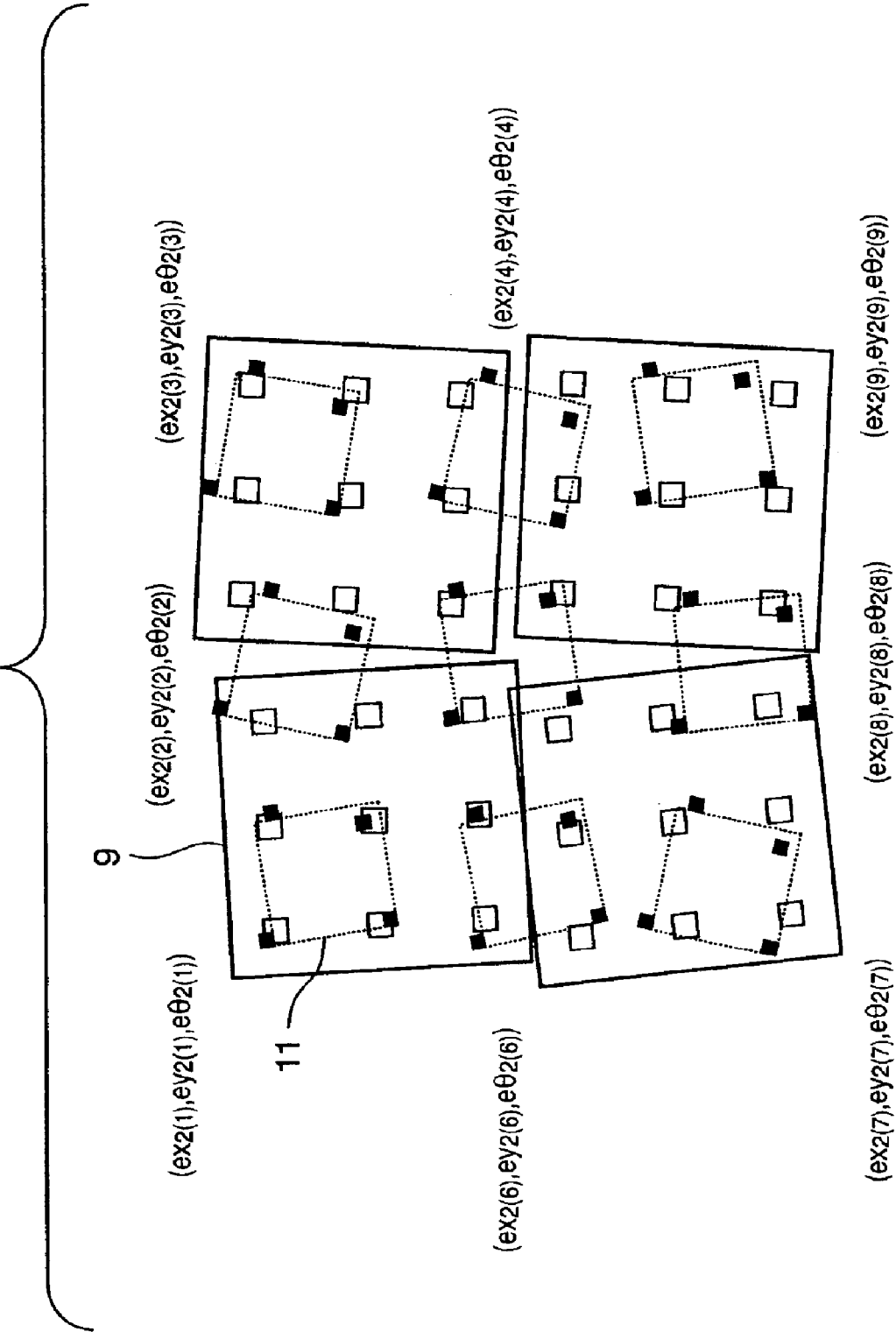
FIG. 7 is a view showing a definition example of the alignment error of each shot transferred by the second layer.
Figure 8B:
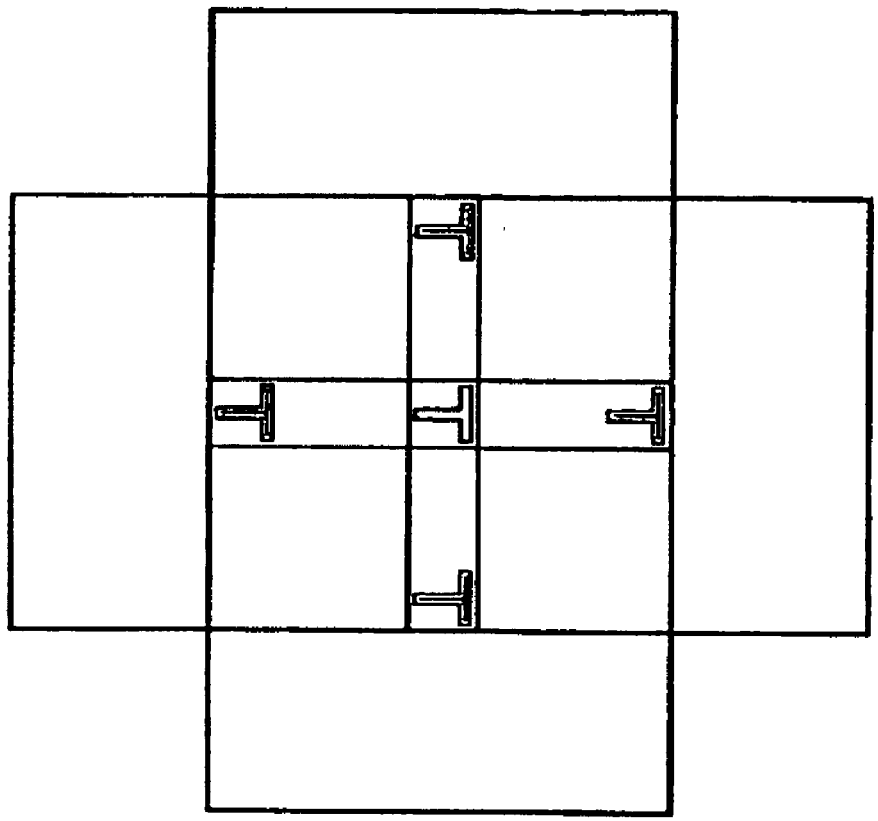
FIGS. 8A and 8B are views showing reticle-shielded states in the first and second layers in the prior art.
Figure 8A:
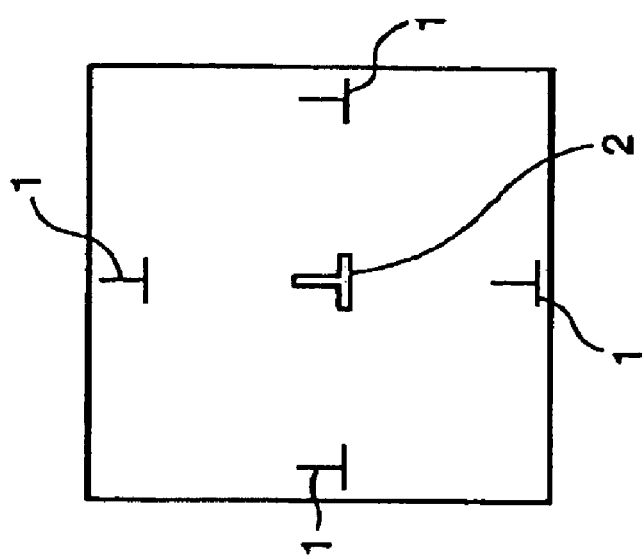
Figure 9:
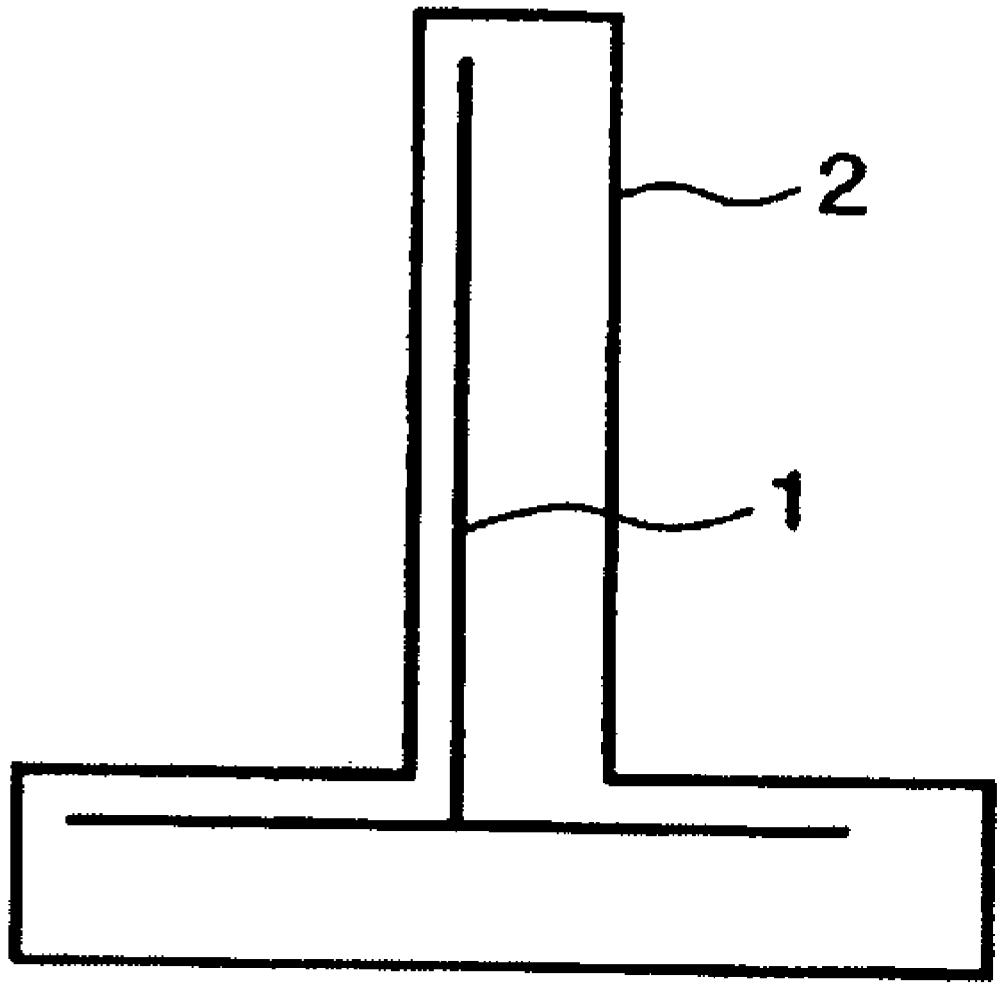
FIG. 9 is a view for explaining a conventional distortion measurement method.
Figures 11A, 11B:
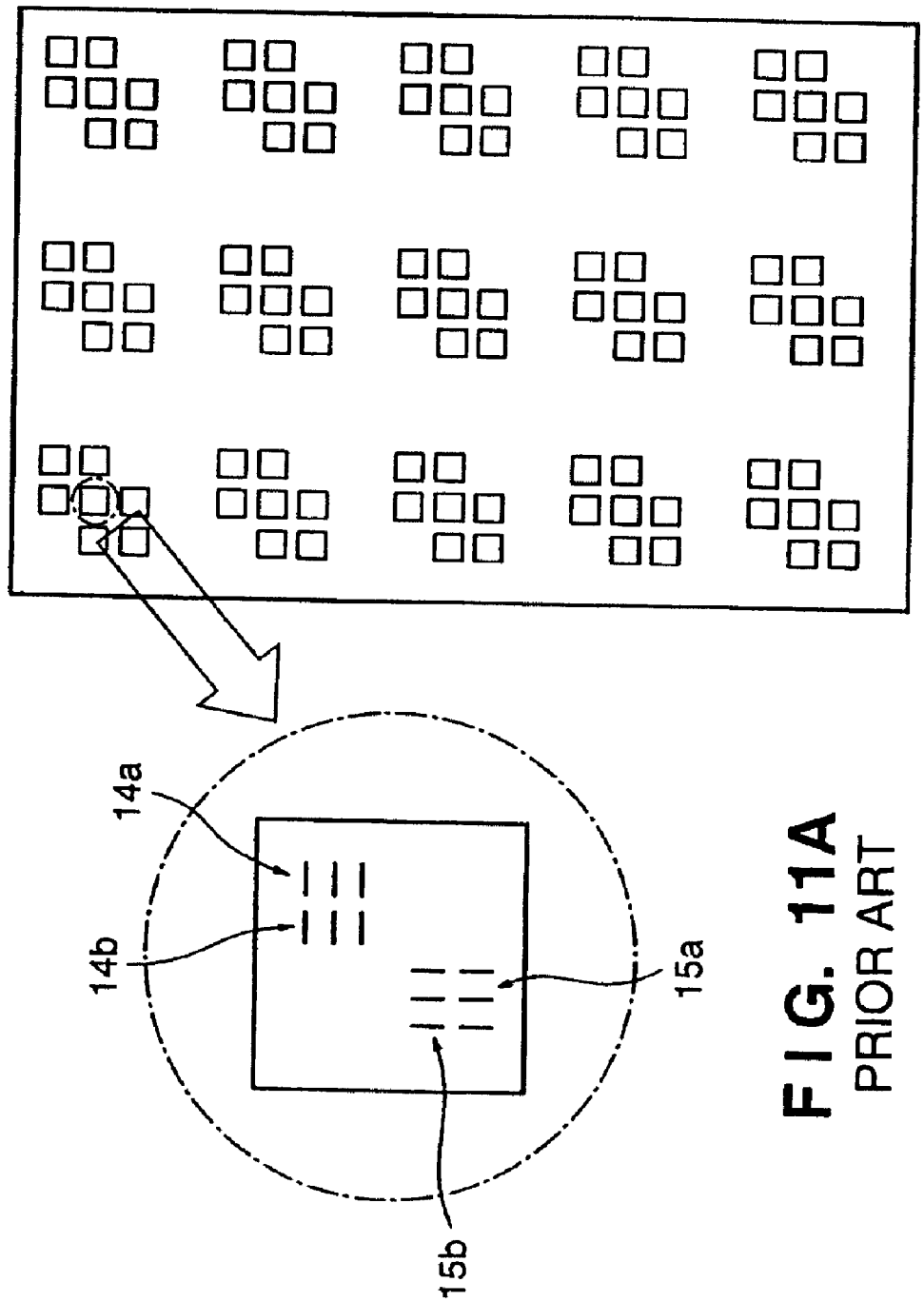
FIGS. 11A and 11B are views for explaining the conventional distortion measurement method.

FIG. 6 shows the definition of the position errors $dx_2$ and $dy_2$ of main scale marks 10 which are simultaneously transferred by the second layer. These errors are caused by a reticle manufacturing error, and appear commonly in each shot 11 (FIG. 7) of the second layer. FIG. 7 shows a state after exposure to all shots on the second layer, i.e., a state in which main scale marks transferred by the second layer overlap vernier scale marks transferred by the first layer.

N overlay marks formed in this way are measured by an automatic reading apparatus (distance between the barycenters of the main scale mark and vernier scale mark is measured). In this example, N=36 marks shown in FIG. 7 are sequentially read. Letting $\delta_x(n)$ and $\delta_y(n)$ be the read values (barycentric distances) of each mark and $n=1, \ldots, N$, $\delta_x(n)$ and $\delta_y(n)$ are given by $$\delta_x(n) = dx_1(i) - dx_2(j) + ex_1(k) - ex_2(l) - Y_1(i)\theta_1(k) + Y_2(j)\theta_2(l) + \varepsilon_x(n) \tag{1}$$

$$\delta_y(n) = dy_1(i) - dy_2(j) + ey_1(k) - ey_2(l) + X_1(i)\theta_1(k) - X_2(j)\theta_2(l) + \varepsilon_y(n) \tag{2}$$

where $\delta_x(n)$, $\delta_y(n)$: measurement values of the nth overlay mark
$dx_1(i)$, $dy_1(i)$: misalignment amounts of the ith distortion evaluation vernier scale mark
$dx_2(j)$, $dy_2(j)$: misalignment amounts of the jth main measurement mark at four measurement points ($m_2 \times n_2$ points)
$ex_1(k)$, $ey_1(k)$, $\theta_1(k)$: alignment errors of the kth shot on the first layer
$ex_2(l)$, $ey_2(l)$, $\theta_2(l)$: alignment errors of the lth shot on the second layer
$X_1(i)$, $Y_1(i)$: coordinates of the ith mark within a shot on the first layer
$X_2(j)$, $Y_2(j)$: coordinates of the jth mark within a shot on the second layer
$\varepsilon_x(n)$, $\varepsilon_y(n)$: quantization errors by rounding.

If $\varepsilon_x(n)$ and $\varepsilon_y(n)$ are negligibly small, unknown variables are $m_1 \times n_1$ $dx_1(i)$, $dy_1(i)$, $ex_2(l)$, $ey_2(l)$, and $\theta_2(l)$, and $m_2 \times n_2$ $dx_2(j)$, $dy_2(j)$, $ex_1(k)$, $\theta_1(k)$, and $ey_1(k)$. The number of unknown variables is $5 \times (m_1 \times n_1 + m_2 \times n_2)$.

The N overlay marks are formed from $m_1 \times n_1$ vernier scale marks i, $m_2 \times n_2$ main scale marks j, $m_2 \times n_2$ first layer exposure shots k, and $m_1 \times n_1$ second layer exposure shots l. The combination of i, j, k, and l for each overlay mark changes between all marks. In other words, equations (1) and (2) are combined into $2 \times (m_1 \times n_1 \times m_2 \times n_2)$ (2N) simultaneous equations.

At this time, if conditions by equations (3) to (14) are added, the simultaneous equations are determined to obtain a solution which minimizes the sum of squares of $\varepsilon_x(n)$ and $\varepsilon_y(n)$.

$$\sum_{j=1}^{m_2 \times n_2} dx_2(j) = 0 \tag{3}$$

$$\sum_{j=1}^{m_2 \times n_2} dy_2(j) = 0 \tag{4}$$

$$\sum_{k=1}^{m_2 \times n_2} ex_1(k) = 0 \tag{5}$$

$$\sum_{k=1}^{m_1 \times n_1} ey_1(k) = 0 \tag{6}$$

$$\sum_{k=1}^{m_1 \times n_1} \theta_1(k) = 0 \tag{7}$$

$$\sum_{l=1}^{m_1 \times n_1} Y_2(l)ex_2(l) = 0 \tag{8}$$

$$\sum_{l=1}^{m_1 \times n_1} X_2(l)ey_2(l) = 0 \tag{9}$$

-continued $$\sum_{l=1}^{m_1 \times n_1} X_2(l) ex_2(l) = 0 \quad (10)$$

$$\sum_{l=1}^{m_1 \times n_1} Y_2(l) ey_2(l) = 0 \quad (11)$$

$$\sum_{l=1}^{m_1 \times n_1} ex_2(l) = 0 \quad (12)$$

$$\sum_{l=1}^{m_1 \times n_1} ey_2(l) = 0 \quad (13)$$

$$\sum_{l=1}^{m_1 \times n_1} \theta_2(l) = 0 \quad (14)$$

By solving the simultaneous equations, the stage alignment errors $ex_1$, $ey_1$, $ex_2$, and $ey_2$, and the reticle manufacturing errors $dx_2$ and $dy_2$ can also be obtained at the same time as the distortion evaluation amounts $dx_1$ and $dy_1$. No stage alignment error is contained in the distortion evaluation amount.

As described above, according to the embodiment, no stage alignment error is contained in the distortion evaluation amount, unlike the above-described conventional distortion measurement method (1). High-precision distortion measurement can therefore be realized.

In actual distortion measurement, about 100 vernier scale marks are simultaneously transferred for each shot. The number of exposure operations using the second layer is equal to the number of vernier scale marks within a shot. The number of shots of the first layer is larger by only three (when the number of shots of the first layer is 2×2 (four)). The exposure time is almost equal to the exposure time of one shot by the above-described conventional distortion measurement method (1).

Figure 12:
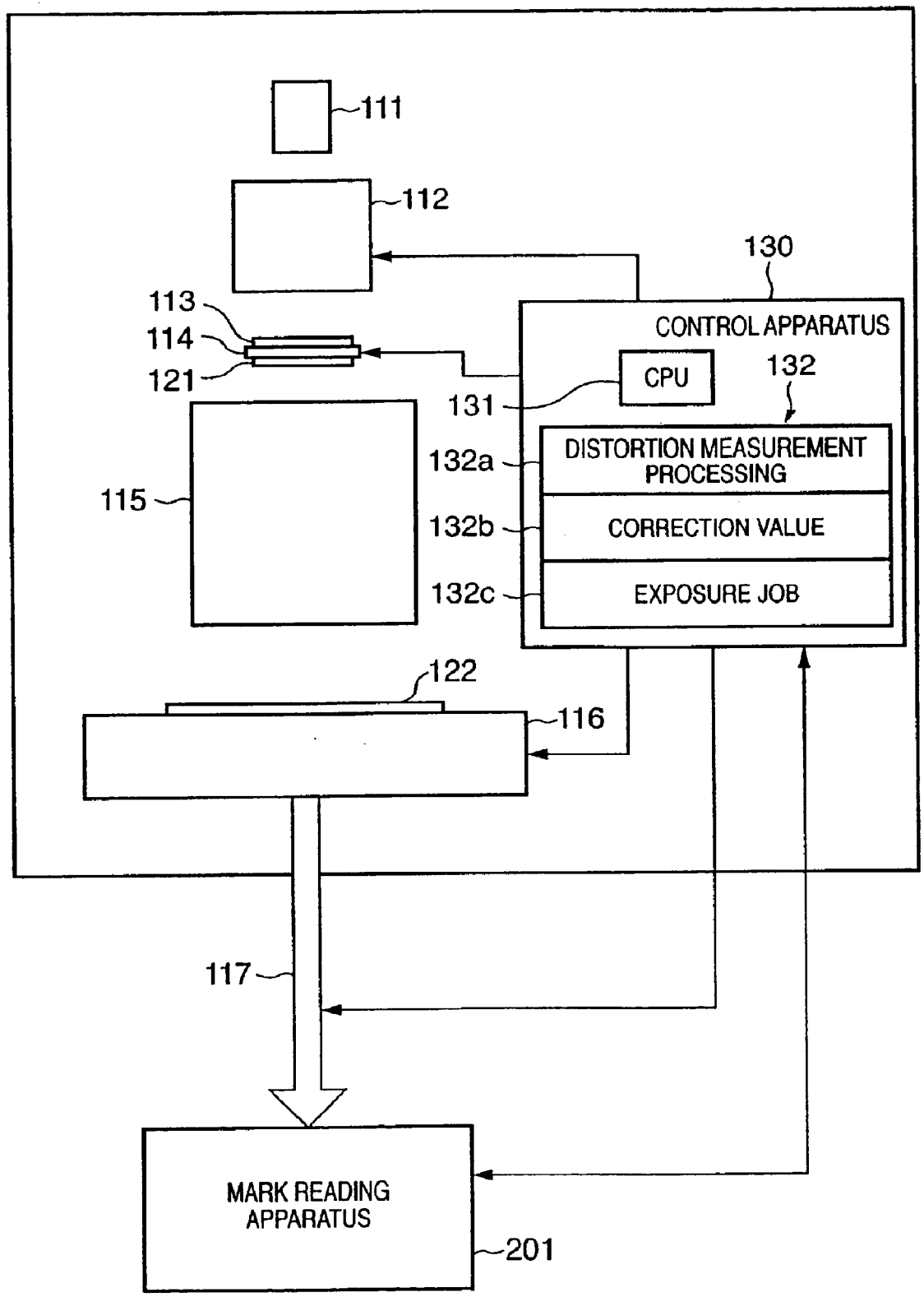
FIG. 12 is a block diagram for explaining an exposure system which realizes the distortion measurement method of the embodiment.

An exposure control apparatus which executes the distortion measurement method will be explained. FIG. 12 is a block diagram showing the arrangements of an exposure apparatus, an exposure control apparatus, and a mark reading apparatus according to the embodiment. Reference numeral 101 denotes an exposure apparatus which comprises an exposure light source 111, an illumination optical system 112, a light-shielding plate 113, a reticle stage 114, a projection optical system 115, and a wafer stage 116. The reticle stage 114 supports a reticle 121 on which the above-described vernier scale marks and main scale marks are drawn. The wafer stage 116 supports a photosensitive substrate 122.

Reference numeral 130 denotes a control apparatus which controls the exposure apparatus 101 by a CPU 131. The CPU 131 executes various control operations in accordance with a control program stored in a memory 132. Reference numeral 132a denotes a distortion measurement processing program which is executed by the CPU to execute the above-described distortion measurement processing; 132b, an exposure control correction value which is calculated from a distortion measurement value obtained by distortion measurement processing; and 132c, an exposure job which stores various parameters in exposure processing. While correcting the correction value 132b, the CPU 131 executes exposure processing in accordance with the exposure job 132c, realizing high-precision exposure.

Figure 13:
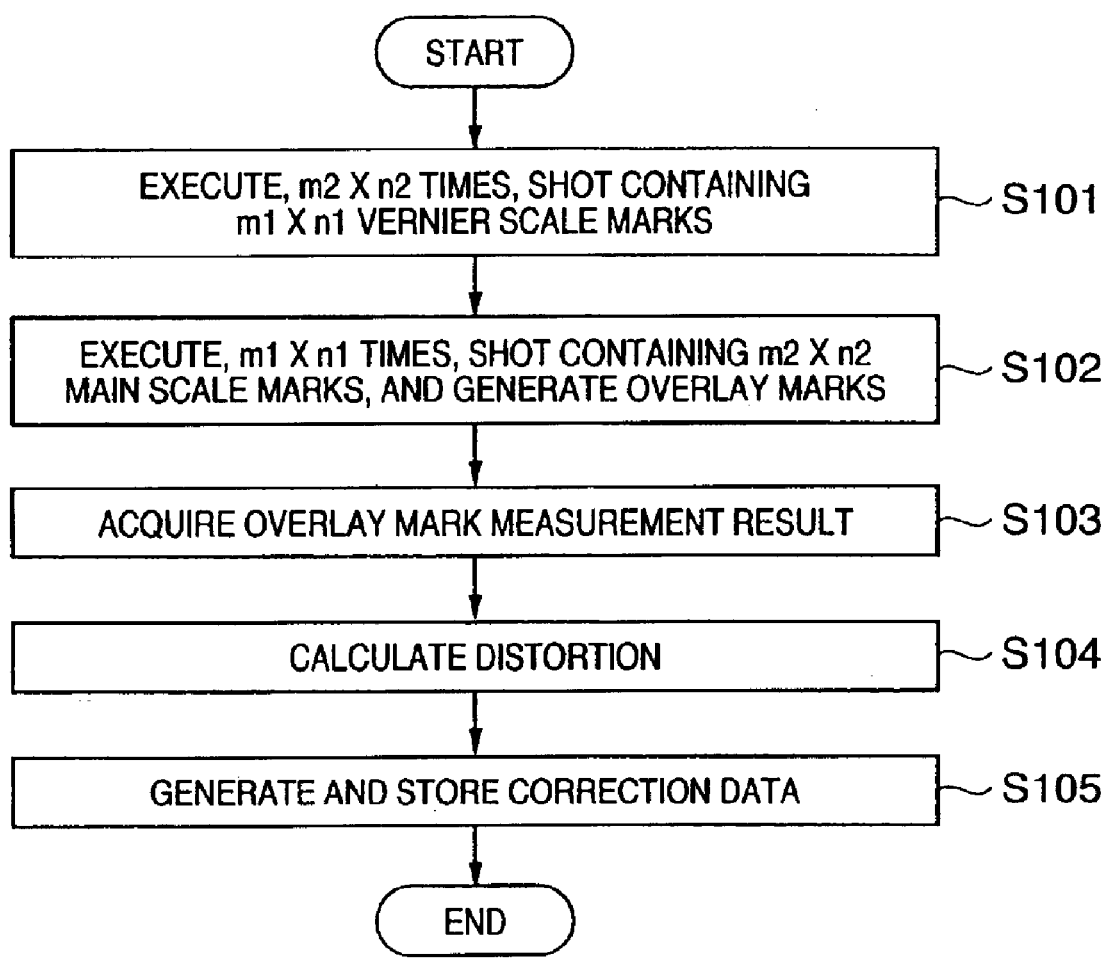
FIG. 13 is a flow chart for explaining the operation of an exposure control apparatus which executes the distortion measurement method of the embodiment.

FIG. 13 is a flow chart for explaining processing by the distortion measurement processing program 132a.

In step S101, the light-shielding plate 113 is controlled, and exposure processing using, as one shot, the entire surface of the reticle 121 having $m_1 \times n_1$ vernier scale marks is repeated $m_2 \times n_2$ times. In step S102, the light-shielding plate 113 is so controlled as to set $m_2 \times n_2$ main scale marks as one shot. Exposure processing using this shot is repeated $m_1 \times n_1$ times, forming $m_1 \times n_1 \times m_2 \times n_2$ (=N) overlay marks.

In step S103, the photosensitive substrate having the overlay marks formed on it is developed using a transport/developing processing system 117. The photosensitive substrate is supplied to a mark reading apparatus 201 to measure the overlay marks, acquiring measurement results ($\delta_x(1)$ to $\delta_x(N)$ and $\delta_y(1)$ to $\delta_y(N)$). In photosensitive substrate developing processing or supply to the mark reading apparatus, another apparatus controlled by another control apparatus may be used manually. In this case, measurement results are merely acquired from the mark reading apparatus 201 in step S103.

In step S104, the distortion (and stage alignment error and reticle manufacturing error) is calculated by solving the above-described simultaneous equations. In step S105, in executing an exposure job, a correction value for correcting the calculated distortion is calculated and stored in the memory 132.

The light-shielding plate 113 is set on the reticle stage in this example, but may be set within the illumination optical system. In short, the light-shielding plate 113 suffices to realize a function of restricting illumination light so as to set a predetermined number of main scale marks as one shot, as shown in FIG. 1B. This function may be realized by a method other than the light-shielding plate.

A device production method using the above-described exposure apparatus will be explained.

Figure 14:
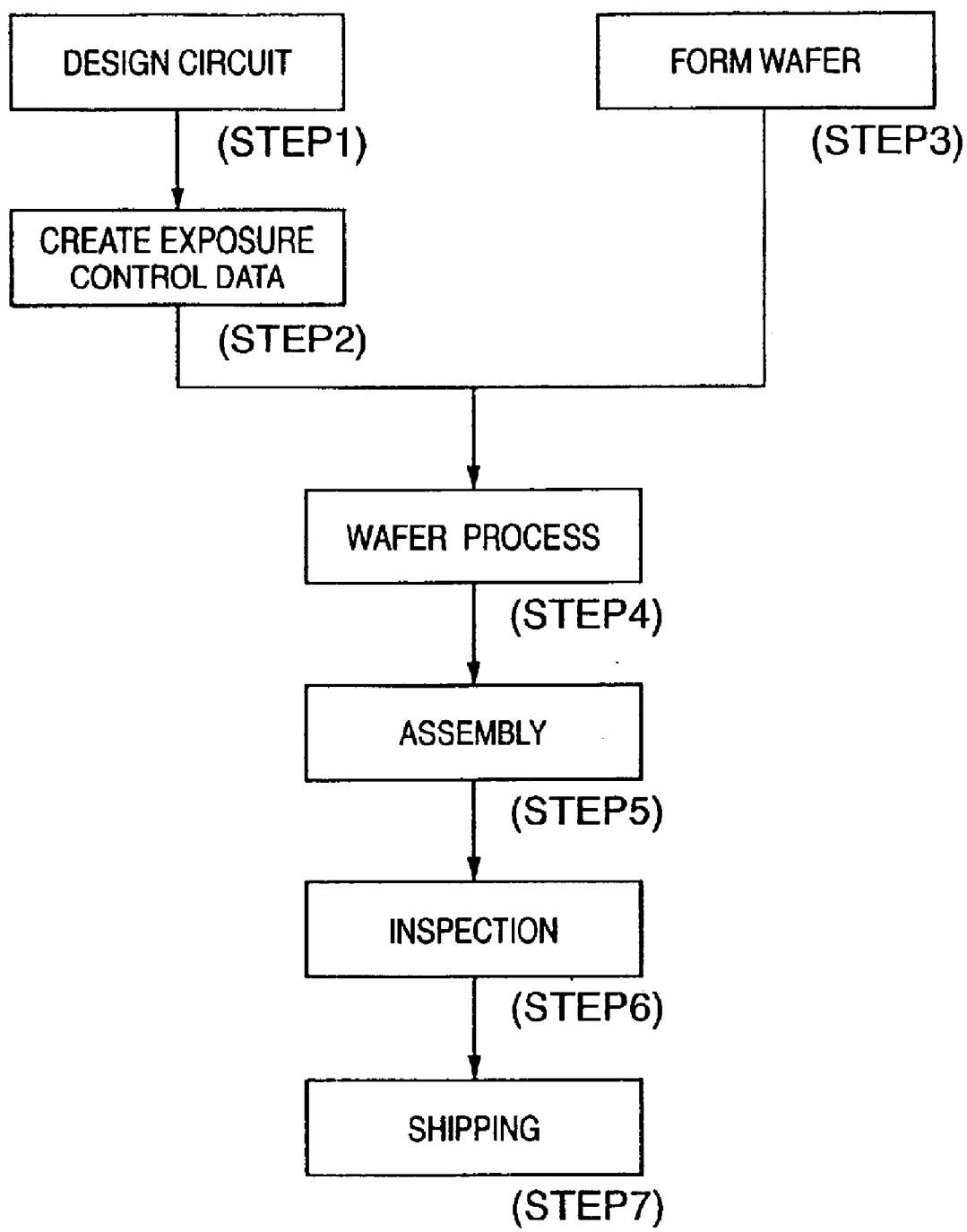
FIG. 14 is a flow chart showing the manufacturing flow of a microdevice.

FIG. 14 shows the manufacturing flow of a microdevice (e.g., a semiconductor chip such as an IC or LSI, a liquid crystal panel, a CCD, a thin-film magnetic head, a micromachine, or the like). In step 1 (circuit design), a semiconductor device circuit is designed. In step 2 (exposure control data creation), exposure control data (exposure job) of the exposure apparatus is created on the basis of the designed circuit pattern. In step 3 (wafer formation), a wafer is formed using a material such as silicon. In step 4 (wafer process), called a pre-process, an actual circuit is formed on the wafer by lithography using the wafer and the exposure apparatus which has received the prepared exposure control data. At this time, the exposure control data is properly corrected using the correction value 132b, and high-precision exposure processing is executed. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 15:
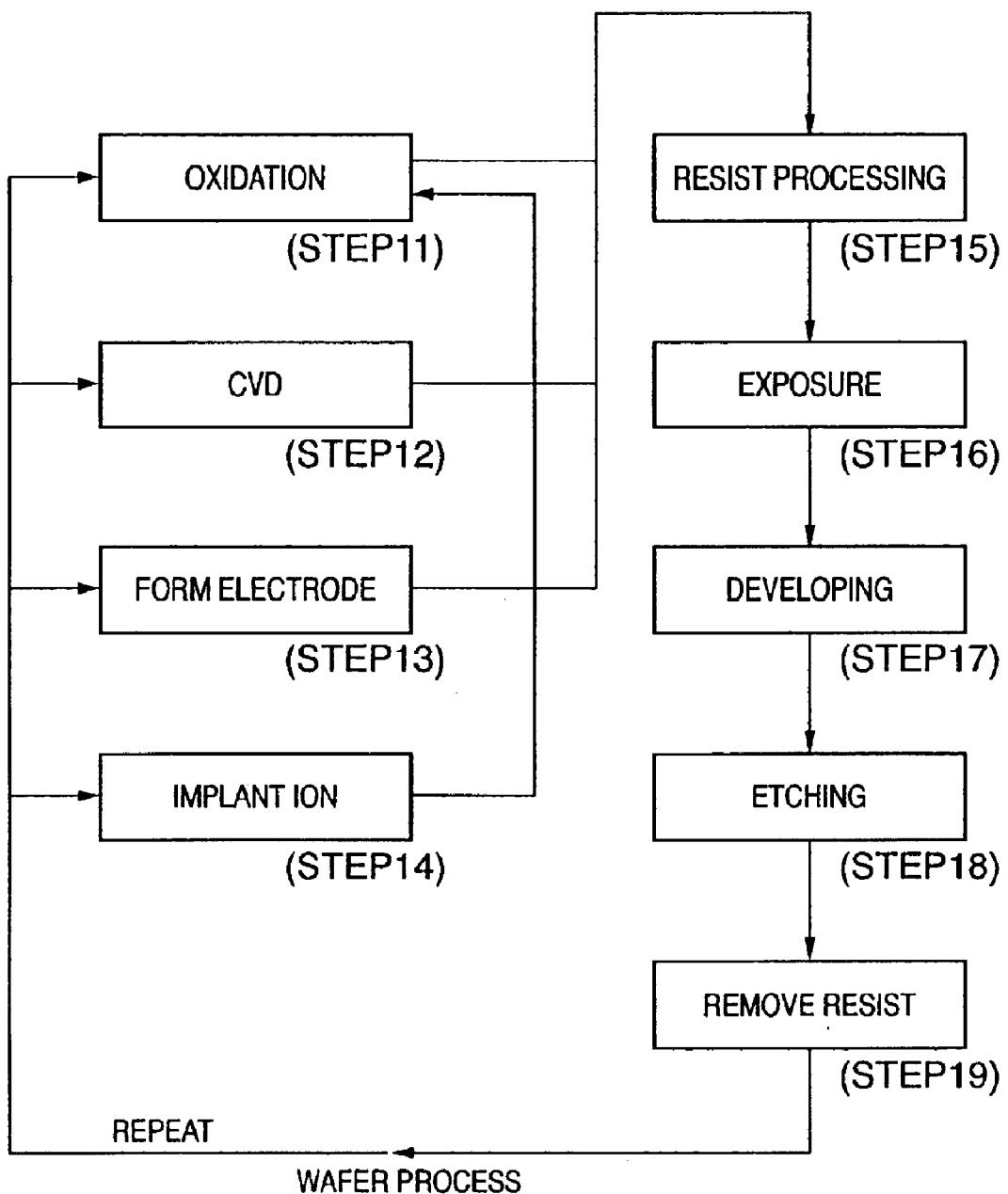
FIG. 15 is a flow chart showing the detailed flow of the wafer process in FIG. 14.

FIG. 15 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to a circuit pattern. In step 17 (developing), the exposed wafer is developed. In step 18 (etching), the resist is etched except the developed resist image. In step 19 (resist removal), an unnecessary resist after etching is removed. These steps are repeated to form multiple circuit patterns on the wafer.

The manufacturing method of the embodiment can manufacture at low cost a high-integration-degree semiconductor device which is difficult to manufacture by the prior art.

As has been described above, the present invention can achieve distortion measurement at a higher precision.

As many apparently widely different embodiments of the present invention can be made without departing from the spirit and scope thereof, it is to be understood that the invention is not limited to the specific embodiments thereof except as defined in the claims.

What is claimed is:

1. A distortion measurement method comprising:
   a first formation step of repeating, m×n times, shot exposure of arranging first marks on a photosensitive substrate via a reticle and a projection optical system in M rows and N columns at a predetermined column interval and a predetermined row interval, thereby forming first marks in M×m rows and N×n columns on the photosensitive substrate, M and m being natural numbers which are relatively prime, N and n being natural numbers which are relatively prime, and M>m and N>n;
   a second formation step of repeating, M×N times, shot exposure of arranging second marks on the photosensitive substrate via the reticle in m rows and n columns at the predetermined column interval and the predetermined row interval, thereby forming second marks in M×m rows and N×n columns on the photosensitive substrate, the first and second marks formed in the first and second formation steps forming M×m×N×n overlay marks;
   a measurement step of measuring misalignment amounts of the first and second marks for each of the M×m×N×n overlay marks; and
   a calculation step of calculating a distortion amount of the projection optical system on the basis of the misalignment amounts measured in the measurement step.

2. The method according to claim 1, wherein
   letting $p_x$ be the predetermined column interval and $p_y$ be the predetermined row interval,
   in the first step, shot exposure is repeated at a shot interval of $p_x \times N$ in a row direction and a shot interval of $p_y \times M$ in a column direction, and
   in the second step, shot exposure is repeated at a shot interval of $p_x \times n$ in the row direction and a shot interval of $p_y \times m$ in the column direction.

3. The method according to claim 1, wherein in the calculation step, a distortion amount is calculated for a ξth overlay mark formed from an ith first mark of a kth shot in the first formation step and a jth second mark of an lth shot in the second formation step by solving 2×M×m×N×n simultaneous equations obtained by substituting misalignment amount measurement values $\delta_x(\xi)$ and $\delta_y(\xi)$ in X and Y directions that are measured in the measurement step into $$\delta_x(\xi) = dx_1(i) - dx_2(j) + ex_1(k) - ex_2(l) - Y_1(i)\theta_1(k) + Y_2(j)\theta_2(l)$$

$$\delta_y(\xi) = dy_1(i) - dy_2(j) + ey_1(k) - ey_2(l) - X_1(i)\theta_1(k) + X_2(j)\theta_2(l)$$

where
   $dx_1(i), dy_1(i)$: misalignment amounts of the ith first mark
   $dx_2(j), dy_2(j)$: misalignment amounts of the jth second mark
   $ex_1(k), ey_1(k), \theta_1(k)$: alignment errors of the kth shot in the first formation step
   $ex_2(l), ey_2(l), \theta_2(l)$: alignment errors of the lth shot in the second formation step
   $X_1(i), Y_1(i)$: coordinates of the ith first mark within the shot
   $X_2(j), Y_2(j)$: coordinates of the jth second mark within the shot.

4. The method according to claim 3, wherein when the simultaneous equations are solved in the calculation step, a respective sum of $dx_2(j), dy_2(j), ex_1(k), ey_1(k), \theta_1(k), ex_2(l), ey_2(l)$, and $\theta_2(l)$ is assumed to be 0, and a respective sum of $X_2(l)\times ex_2(l), Y_2(l)\times ey_2(l), Y_2(l)\times ex_2(l)$, and $X_2(l)\times ey_2(l)$ is assumed to be 0, for all the overlay marks.

5. The method according to claim 1, wherein the misalignment amount includes a misalignment amount between respective barycentric positions of the first and second marks which constitute the overlay mark.

6. A distortion measurement apparatus comprising:
   control means for controlling an exposure apparatus so as to form m×m×N×n overlay marks on a photosensitive substrate by repeating, m×n times, shot exposure of arranging first marks on the photosensitive substrate via a reticle and a projection optical system in M rows and N columns at a predetermined column interval and a predetermined row interval to form first marks in M×m rows and N×n column on the photosensitive substrate, and by repeating M×N times, shot exposure of arranging second marks on the photosensitive substrate via the reticle in m rows and n columns at the predetermined column interval and the predetermined row interval to form second marks in M×m rows and N×n columns on the photosensitive substrate, M and m being natural numbers which are relatively prime, N and n being natural numbers which are relatively prime, and M>m and N>n;
   measurement means for measuring misalignment amounts of the first and second marks for each of the M×m×N×n overlay marks; and
   calculation means for calculating a distortion amount of the projection optical system on the basis of the misalignment amounts of the first and second marks which are measured for each of the M×m×N×n overlay marks.

7. The apparatus according to claim 6, wherein
   letting $p_x$ be the predetermined column interval and $p_y$ be the predetermined row interval,
   said control means repeats shot exposure at a shot interval of $p_x \times N$ in a row direction and a shot interval of $p_y \times M$ in a column direction to form the first marks in the M×m rows and the N×n columns, and repeats shot exposure at a shot interval of $p_x \times n$ in the row direction and a shot interval of $p_y \times m$ in the column direction to form the second marks in the M×m rows and the N×n columns.

8. The apparatus according to claim 6, wherein said calculation means calculations a distortion amount for a ξth overlay mark formed from an ith first mark of a kth shot by said first formation means and a jth second mark of an lth shot by said second formation means by solving 2×M×m×N×n simultaneous equations obtained by substituting misalignment amount measurement values $\delta_x(\xi)$ and $\delta_y(\xi)$ in X and Y directions that are measured by said measurement means into $$\delta_x(\xi) = dx_1(i) - dx_2(j) + ex_1(k) - ex_2(l) - Y_1(i)\theta_1(k) + Y_2(j)\theta_2(l)$$

$$\delta_y(\xi) = dy_1(i) - dy_2(j) + ey_1(k) - ey_2(l) - X_1(i)\theta_1(k) + X_2(j)\theta_2(l)$$

where
   $dx_1(i), dy_1(i)$: misalignment amounts of the ith first mark
   $dx_2(j), dy_2(j)$: misalignment amounts of the jth second mark $ex_1(k), ey_1(k), \theta_1(k)$: alignment errors of the kth shot by said first formation means $ex_2(l), ey_2(l), \theta_2(l)$: alignment errors of the ith shot by said second formation means $X_1(i), Y_1(i)$: coordinates of the lth first mark within the shot $X_2(j), Y_2(j)$: coordinates of the jth second mark within the shot.

9. The apparatus according to claim 8, wherein when said calculation means solves the simultaneous equations, a respective sum of $dx_2(j), dy_2(j), ex_1(k), ey_1(k) \theta_1(k), ex_2(l), ey_2(l)$, and $\theta_2(l)$ is assumed to be 0, and a respective sum of $X_2(l) \times ex_2(l), Y_2(l) \times ey_2(l), Y_2(l) \times ex_2(l)$, and $X_2(l) \times ey_2(l)$ is assumed to be 0, for all the overlay marks.

10. The apparatus according to claim 6, wherein the misalignment amount includes a misalignment amount between respective barycentric positions of the first and second marks which constitute the overlay mark.

11. An exposure apparatus comprising:
exposure means for transferring an image on a reticle onto a wafer by exposure light; and
storage means for generating and storing a correction value for exposure processing on the basis of a distortion amount obtained by executing a distortion measurement method defined in claim 1,
wherein the correction value is reflected in exposure processing by said exposure means.

12. A device manufacturing method comprising steps of:
installing manufacturing apparatuses for performing various processes, including an exposure apparatus defined in claim 11, in a semiconductor manufacturing factory; and
manufacturing a semiconductor device by performing a plurality of processes using the manufacturing apparatuses.

13. A method comprising:
a first exposure step of exposing each of first shot regions on a substrate to a plurality of first marks aligned at a predetermined interval via a master and a projection optical system;
a second exposure step of exposing each of second shot regions on the substrate to a plurality of second marks aligned at the predetermined interval via the master and the projection optical system, the first and second shot regions being so arranged as to make positions of a plurality of transferred first and second marks on the substrate correspond to each other, the plurality of transferred first and second marks being formed due to said first and second exposure steps, respectively, and the number for the transferred first marks in the first shot region being larger than the number of the transferred second marks in the second shot region; and
a calculation step of calculating a distortion amount of the projection on optical system based on a positional difference measured for the transferred first and second marks which correspond to each other.

14. A storage medium storing a program which causes a computer to execute a method, the method comprising:
a first exposure step of exposing each of first shot regions on a substrate to a plurality of first marks aligned at a predetermined interval via a master and a projection optical system;
a second exposure step of exposing each of second shot regions on the substrate to a plurality of second marks aligned at the predetermined interval via the master and the projection optical system, the first and second shot regions being so arranged as to make positions of a plurality of transferred first and second marks on the substrate correspond to each other, the plurality of transferred first and second marks being formed due to said first and second exposure steps, respectively, and the number of the transferred first marks in the first shot region being larger than the number of the transferred second marks in the second shot region; and
a calculation step of calculating a distortion amount of the projection optical system based on a positional difference measured for the transferred first and second marks which correspond to each other.

15. An exposure apparatus comprising:
an exposure unit which exposes a substrate to a master pattern via projection optical system; and
a control unit which executes a method defined in claim 13 to obtain a distortion amount of the projection optical system, and controls an exposure process by said exposure unit based on the obtained distortion amount.

16. A device manufacturing method comprising:
providing an exposure apparatus defined in claim 15; and
manufacturing a device using the exposure apparatus.

17. A method comprising:
a first projection step of projecting a plurality of first marks aligned at a predetermined interval on a reticle onto each of first shot regions on a substrate via a projection optical system;
a second projection step of projecting a plurality of second marks aligned at the predetermined interval on the reticle onto each of second shot regions on the substrate via the projection optical system, the first and second shot regions being so arranged as to make positions of a plurality of transferred first and second marks on the substrate correspond to each other, the plurality of transferred first and second marks being formed due to said first and second projection steps, respectively, and a size of the first shot region being larger than a size of the second shot region; and
a calculation step of calculating a distortion amount of an image formed by the projection optical system based on a positional difference measured with respect to the transferred first and second marks which correspond to each other.

18. A storage medium storing a program which causes a computer to execute a method, said method comprising:
a first projection step of projecting a plurality of first marks aligned at a predetermined interval on a reticle onto each of first shot regions on a substrate via a projection optical system;
a second projection step of projecting a plurality of second marks aligned at the predetermined interval on the reticle onto each of second shot regions on the substrate via the projection optical system, the first and second shot regions being so arranged as to make positions of a plurality of transferred first and second marks on the substrate correspond to each other, the plurality of transferred first and second marks being formed due to said first and second projection steps, respectively, and a size of the first shot region being larger than a size of the second shot region; and
a calculation step of calculating a distortion amount of an image formed by the projection optical system based on a positional difference measured with respect to the transferred first and second marks which correspond to each other.

19. An exposure apparatus comprising:

an exposure unit which includes a projection optical system and projects a pattern of a reticle onto a substrate via said projection optical system; and a control unit which executes a method as defined in claim 17 to obtain a distortion amount of an image formed by said projection optical system, and controls an exposure process by said exposure unit based on the obtained distortion amount.

20. A device manufacturing method comprising steps of:

projecting a pattern of a reticle onto a substrate using an exposure apparatus as defined in claim 19; and developing the substrate onto which the pattern has been projected.

21. A device manufacturing method comprising steps of:

calculating a distortion amount of an image formed by a projection optical system of an exposure apparatus using a method as defined in claim 17;

determining a value, for controlling a process of exposure of a substrate to a pattern of a reticle via the projection optical system to be performed by the exposure apparatus, based on the distortion amount;

controlling a process of exposure of the substrate to the pattern performed by the exposure apparatus based on the determined value; and developing the substrate for which the exposure has been performed.

* * * * *

UNITED STATES PATENT AND TRADEMARK OFFICE
CERTIFICATE OF CORRECTION

PATENT NO. : 6,947,119 B2
DATED : September 20, 2005
INVENTOR(S) : Youzou Fukagawa It is certified that error appears in the above-identified patent and that said Letters Patent is hereby corrected as shown below:

Column 9,
Line 32, "over" should read -- overlay --.
Line 33, "ay" should be deleted.

Column 10,
Line 23, "column" should read -- columns --.
Line 51, "calculations" should read -- calculates --.

Column 11,
Line 3, "ith" should read -- lth --.
Line 5, "lth" should read -- ith --.
Line 11, "$ey_1(k)$" should read -- $ey_1(k)$, --.
Line 49, "for" should read -- of --.
Line 53, the first occurrence of "on" should be deleted.

Column 12,
Line 14, "projection" should read -- a projection --.

Signed and Sealed this

Seventh Day of February, 2006

JON W. DUDAS
*Director of the United States Patent and Trademark Office*